US010615711B2

(12) United States Patent
Cho et al.

(10) Patent No.: US 10,615,711 B2
(45) Date of Patent: Apr. 7, 2020

(54) APPARATUS FOR CONTROLLING OUTPUT VOLTAGE FOR SINGLE-TYPE CONVERTER, AND METHOD THEREFOR

(71) Applicant: KOREA ELECTRIC POWER CORPORATION, Naju-si (KR)

(72) Inventors: Jin-Tae Cho, Daejeon (KR); Ju-Yong Kim, Daejeon (KR); Jae-Han Kim, Daejeon (KR); Young-Pyo Cho, Daejeon (KR)

(73) Assignee: KOREA ELECTRIC POWER CORPORATION, Naju-si (KR)

( * ) Notice: Subject to any disclaimer, the term of this patent is extended or adjusted under 35 U.S.C. 154(b) by 0 days.

(21) Appl. No.: 16/334,742

(22) PCT Filed: Nov. 11, 2016

(86) PCT No.: PCT/KR2016/013023
§ 371 (c)(1),
(2) Date: Mar. 19, 2019

(87) PCT Pub. No.: WO2018/079905
PCT Pub. Date: May 3, 2018

(65) Prior Publication Data
US 2019/0273445 A1    Sep. 5, 2019

(30) Foreign Application Priority Data
Oct. 26, 2016   (KR) .......................... 10-2016-0140329

(51) Int. Cl.
*H02M 7/12*      (2006.01)
*H02M 7/487*     (2007.01)
(Continued)

(52) U.S. Cl.
CPC ............. *H02M 7/12* (2013.01); *H02M 3/158* (2013.01); *H02M 7/217* (2013.01); *H02M 7/487* (2013.01);
(Continued)

(58) Field of Classification Search
CPC .......... H02M 1/32; H02M 7/155; H02M 1/00; H02M 7/12; H02M 7/487; H02M 3/158
See application file for complete search history.

(56) References Cited

U.S. PATENT DOCUMENTS 6,084,785  A  *  7/2000  Kunisada ............ H02M 5/4505
                                                363/127
9,692,311  B2 *  6/2017  Kim ........................ H02M 7/10
(Continued)

FOREIGN PATENT DOCUMENTS

JP   H08-289561 A    11/1996
JP   2013-219859 A   10/2013
(Continued)

*Primary Examiner* — Adolf D Berhane
*Assistant Examiner* — Nusrat Quddus
(74) *Attorney, Agent, or Firm* — Foundation Law Group, LLP (57) ABSTRACT

The present invention relates to an apparatus for controlling an output voltage for a single-type converter and a method therefor, the apparatus including: a power input/output unit connected in parallel to both poles of the single-type converter, respectively, thereby receiving and outputting output voltages, respectively; an output voltage and current measurement unit measuring output currents and the output voltages output from the power input/output unit; a controller performing a current limit control for a protection coordination for a first pole and performing a voltage control for a second pole following a checking of a state of the first pole of the both poles of the single-type converter using the measured output currents; a switching unit being switched according to a control performed on the both poles; and a (Continued)

power transfer unit transferring the output voltages of the single-type converter according to switching of the switching unit.

11 Claims, 5 Drawing Sheets

(51) Int. Cl.
  *H02M 3/158*   (2006.01)
  *H03K 17/0814*   (2006.01)
  *H02M 7/217*   (2006.01)
  *H02M 1/32*   (2007.01)
  *H02M 1/00*   (2006.01)

(52) U.S. Cl.
  CPC . *H03K 17/08142* (2013.01); *H02M 2001/007* (2013.01); *H02M 2001/0074* (2013.01); *H02M 2001/0077* (2013.01); *H02M 2001/325* (2013.01)

(56) References Cited

U.S. PATENT DOCUMENTS

| | | | | |
|---|---|---|---|---|
| 2001/0026460 | A1* | 10/2001 | Ito | H02M 5/4585 363/34 |
| 2006/0038546 | A1* | 2/2006 | Lin | H02M 1/32 323/284 |
| 2008/0037960 | A1* | 2/2008 | Biribauer | H02M 1/32 388/820 |
| 2008/0042606 | A1* | 2/2008 | Chen | B60L 15/025 318/474 |
| 2010/0036555 | A1* | 2/2010 | Hosoda | B60L 3/003 701/22 |
| 2011/0013438 | A1 | 1/2011 | Frisch et al. | |
| 2012/0081936 | A1* | 4/2012 | Walters | H02M 7/217 363/80 |
| 2015/0009594 | A1* | 1/2015 | Okaeme | H02H 7/268 361/42 |
| 2015/0295488 | A1* | 10/2015 | Shen | H02M 1/32 363/50 |
| 2017/0012554 | A1* | 1/2017 | Pu | H02M 7/06 |
| 2017/0047856 | A1* | 2/2017 | Luscher | H02M 1/32 |
| 2017/0126165 | A1* | 5/2017 | Rechberger | H02P 29/0241 |
| 2017/0149343 | A1* | 5/2017 | Bhandarkar | H02M 1/126 |
| 2018/0091038 | A1* | 3/2018 | Subramanian | H02M 1/32 |
| 2018/0212533 | A1* | 7/2018 | Nami | H02M 1/32 |
| 2018/0267104 | A1* | 9/2018 | Yang | H02M 1/32 |
| 2019/0157885 | A1* | 5/2019 | Rippel | H02J 7/0042 |

FOREIGN PATENT DOCUMENTS

| | | |
|---|---|---|
| KR | 10-2016-0066099 A | 6/2016 |
| KR | 10-2016-0076379 A | 6/2016 |

* cited by examiner

APPARATUS FOR CONTROLLING OUTPUT VOLTAGE FOR SINGLE-TYPE CONVERTER, AND METHOD THEREFOR

CROSS-REFERENCE TO RELATED APPLICATIONS

This application claims the benefit under 35 U.S.C. Section 371, of PCT International Application No. PCT/KR2016/013023, filed on Nov. 11, 2016, which claimed priority to Korean Patent Application No. KR 10-2016-0140329, filed on Oct. 26, 2016, the disclosures of which are hereby incorporated by the references.

TECHNICAL FIELD

The present invention relates to an apparatus for controlling an output voltage for a single-type converter and a method therefor and, more particularly, to an apparatus for controlling an output voltage for a single-type converter and a method therefor for eliminating unbalance of the output voltage, when a short circuit or an overload situation occurs at a pole of one side of a single-type converter for DC distribution, whereby a current limit is applied for protection coordination at the pole of the one side, by keeping the output voltage of a pole of the other side in a steady state.

BACKGROUND ART

In recent years, as DC consumers such as a DC internet data center (IDC), a DC home, a DC building, and so on have emerged, DC customers have increasingly demanded power supply companies to directly supply DC distribution.

Such DC distribution is a power saving technology. In other words, digitalization of home appliances such as refrigerators, washing machines, and the like as well as existing PCs, TVs, DVDs, and cameras has accelerated because of the development of digital technologies. The power loss in a house arising from power conversion (AC-DC) is 20~30%. The DC distribution reduces the losses arising from such power conversion, thereby improving energy efficiency and enabling the power supply to be high in quality.

In addition, the DC distribution may be largely classified into medium voltage DC (MVDC) distribution and low voltage DC (LVDC) distribution. In particular, the LVDC distribution has a lower power conversion loss than an AC distribution system in connection to a DC load or a DC power supply, has lower installation and operating costs than the MVDC distribution, and has an advantage that an efficient control of a distribution voltage may be performed by using a power converter.

Meanwhile, power supply companies are studying and developing technologies related to the DC distribution worldwide, and, currently, Korea is also under preparation to construct a demonstration line for the LVDC distribution in an existing network system.

Supply methods of the demonstration line for the LVDC distribution may be composed of a monopolar method and a bipolar method. The bipolar method among both methods may increase a supply capacity and supply reliability. In addition, the bipolar method may stably supply power even when consumer capacities supplied through each pole are different, and even when a pole fails, a sound pole may normally supply DC power.

For a system structure of the bipolar method, an AC/DC converter that provides DC power supply from the DC distribution line plays an important role. Accordingly, research on a structure composed of two converters is underway in order to develop an AC/DC converter capable of providing stable power supply even in case of unbalanced loads wherein the load capacities supplied through each pole are different and in case of an occurrence of a fault at a pole.

However, in order to install a converter at an actual electric line site, the converter should be not only easy to install at the site but also compact and economical. For this connection, a single-type converter composed of one converter is preferable to an AC/DC converter composed of two converters, as the converter of the bipolar method for DC distribution electric lines. That is, in the case of the AC/DC converter composed of two converters, because it is difficult to utilize the existing pole/ground transformer, and thus necessary to reinstall a three-winding transformer, it is not easy to use the AC/DC converter for the current distribution electric line. On the other hand, the single-type converter is economical, is capable of being compact, and has good bidirectional power transmission and output quality.

A method to eliminate the load unbalance situation has been proposed, but a conventional single-type converter has difficulty in providing DC power supply normally to a sound pole when a fault occurs at a pole, whereby a current limit is applied for protection coordination.

Accordingly, in regard to the conventional single-type converter, there is a need for a method capable of providing normal DC distribution when a fault occurs at a pole, whereby a current limit is applied for protection coordination.

DISCLOSURE

Technical Problem

An object of the present invention is to provide an apparatus for controlling an output voltage for a single-type converter and a method therefor for eliminating unbalance of the output voltage, when a short circuit or an overload situation occurs at a pole of one side of the single-type converter for DC distribution, whereby a current limit is applied for protection coordination at the pole of the one side, by keeping the output voltage of a pole of the other side in a steady state.

Technical Solution

An apparatus for controlling an output voltage for a single-type converter and a method therefor may include: a power input/output unit connected in parallel to both poles of the single-type converter, respectively, thereby receiving and outputting output voltages, respectively; an output voltage and current measurement unit measuring output currents and the output voltages output from the power input/output unit; a controller performing a current limit control for a protection coordination for a first pole and performing a voltage control for a second pole following a checking of a state of the first pole of the both poles of the single-type converter using the measured output currents; a switching unit being switched according to a control performed on the both poles; and a power transfer unit transferring the output voltages of the single-type converter according to switching of the switching unit.

The power input/output unit may include first and second input capacitors connected in parallel to the both poles of the single-type converter, respectively, thereby receiving the output voltages, respectively; and first and second output capacitors outputting the output voltages of the single-type converter, respectively.

The switching unit may include first and fourth switching units connected in parallel to one ends of the first and second input capacitors, respectively; and second and third switching units connected in series to one ends of the first and fourth switching units, respectively and connected in parallel with respect to the first and second input capacitors, respectively.

When performing a current limit control on the first pole and performing a voltage control on the second pole, the controller may control switching of the first and fourth switching units.

The controller may perform the current limit control for the first and second poles following the checking of the state of the both poles of the single-type converter using the measured output currents.

The controller may control switching of the first and fourth switching units.

The controller may perform the voltage control for the first and second poles following the checking of the state of the both poles of the single-type converter using the measured output voltages.

The controller may control switching of the second and third switching units.

A method for controlling an output voltage for a single-type converter may include: measuring output voltages and currents output from both poles of the single-type converter, respectively; performing a current limit control for a first pole for protection coordination, following checking a state of output currents output from the first pole of the both poles of the single-type converter; and performing a voltage control for a second pole of the both poles of the single-type converter.

The method may further include, after the measuring, performing the current limit control for the first and second poles following checking a state of the output currents output from the both poles of the single-type converter.

The method may further include, after the measuring, performing the voltage control for the first and second poles following checking a state of the output voltages output from the both poles of the single-type converter.

Advantageous Effects

When a short circuit or an overload situation occurs at a pole of one side of the single-type converter for DC distribution, whereby a current limit is applied for protection coordination at the pole of the one side, the present invention may keep the output voltage of the pole of the other side in a steady state. That is, the present invention may control so that the pole of the other side (i.e., the sound pole) is not affected when applying "a current limiting function for protection cooperation in an event of an overload or a short circuit of the pole of the one side", wherein the current limiting function is a function necessary to actually apply the single-type converter to a DC distribution electric line of a bipolar structure.

In addition, the present invention may control the output voltage so as to minimize the volume and price of a rectifier for the DC power distribution.

Further, the present invention may provide a function that enables the final output voltage of the single-type converter to be stably maintained and protection coordination to be performed even when an overload or a short circuit occurs in the DC distribution line of the bipolar method.

MODE FOR INVENTION

For a better understanding of the present invention, a preferred embodiment of the present invention will be described with reference to the accompanying drawings. The embodiments of the present invention may be modified into various forms, and the scope of the present invention should not be construed as being limited to the embodiments described in detail below. The present embodiments are provided to enable those skilled in the art to more fully understand the present invention. Therefore, the shapes and the like of the elements in the drawings may be exaggeratedly expressed to emphasize a clearer description. It should be noted that, in the drawings, the same members are denoted by the same reference numerals. Detailed descriptions of well-known functions and constructions which have been deemed to obfuscate the gist of the present invention will be omitted below.

Figure 1:
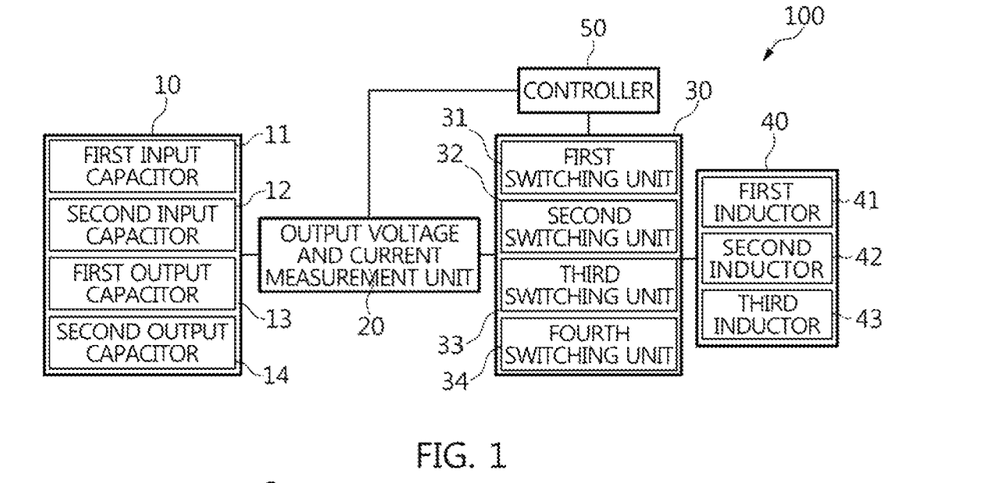
FIG. 1 is a block diagram illustrating an apparatus for controlling an output voltage for a single-type converter according to an embodiment of the present invention.
Figure 2:
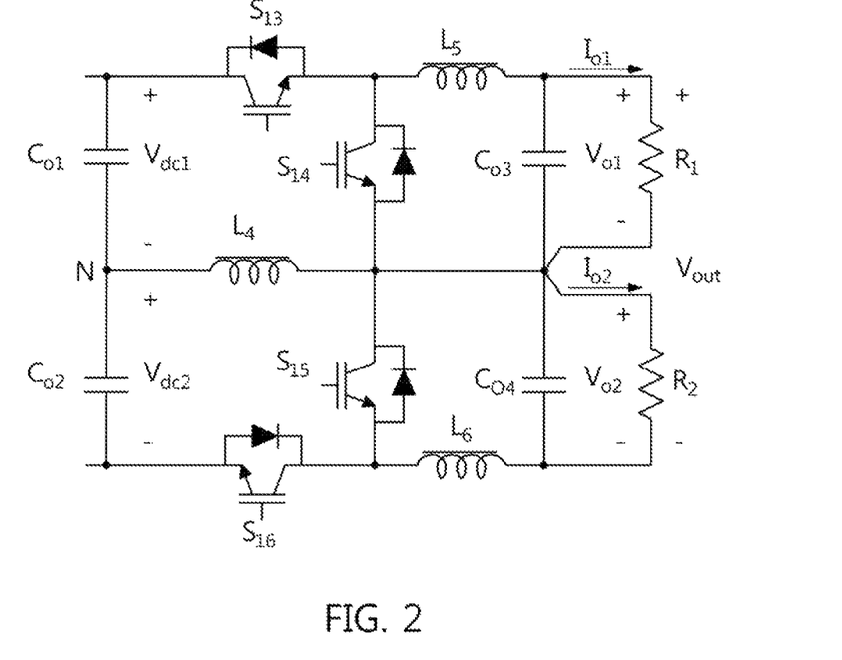
FIG. 2 is a detailed circuit diagram illustrating an apparatus for controlling an output voltage for a single-type converter of FIG. 1.

FIG. 1 is a block diagram illustrating an apparatus for controlling an output voltage for a single-type converter according to an embodiment of the present invention, and FIG. 2 is a detailed circuit diagram illustrating an apparatus for controlling an output voltage for a single-type converter of FIG. 1.

As illustrated in FIGS. 1 and 2, when a short circuit or an overload situation occurs at a pole of one side of a single-type converter for DC distribution, whereby a current limit is applied for protection coordination at the pole of the one side, an apparatus for controlling an output voltage for a single-type converter (hereinafter, referred to as the "apparatus for controlling the output voltage") 100 according to an embodiment of the present invention may keep the output voltage of a pole of the other side in a steady state. That is, the apparatus for controlling the output voltage 100 controls the unbalanced output voltage to the steady state output voltage, wherein the unbalanced output voltage is generated as the protection coordination progresses in the single-type converter for supplying the DC power in the actual system. That is, the apparatus for controlling the output voltage 100 may control so that the pole of the other side (i.e., the sound pole) is not affected when applying "a current limiting function for protection cooperation in an event of an overload or a short circuit of the pole of the one side", wherein the current limiting function is a function necessary to actually apply the single-type converter to a DC distribution electric line of a bipolar structure.

Here, the single-type converter is an AC-DC rectifier of a neutral point clamped (NPC) structure having bipolar outputs, and the apparatus for controlling the output voltage 100 may be used for output voltage balancing, current limiting, and short-circuit protection.

The apparatus for controlling the output voltage 100 includes a power input/output unit 10, an output voltage and current measurement unit 20, a switching unit 30, a power transfer unit 40, and a controller 50.

The power input/output unit 10 receives the output voltage of the single-type converter through input terminals, and outputs the output voltage delivered from the input terminals to a first load $R_1$ and a second load $R_2$ through output terminals. An output current $I_{o1}$ enters into the first load $R_1$ and an output current $I_{o2}$ enters into the second load $R_2$.

The input terminals and output terminals are connected in parallel to each other. Here, the input terminals include first and second input capacitors $C_{o1}$ and $C_{o2}$, and the output terminals include first and second output capacitors $C_{o3}$ and $C_{o4}$.

The first and second input capacitors $C_{o1}$ and $C_{o2}$ are arranged symmetrically with respect to the neutral point of the single-type converter, and one ends thereof are connected in series to each other. In addition, the other ends of the first and second input capacitors $C_{o1}$ and $C_{o2}$ are connected to both poles of the single-type converter, respectively. That is, the first and second input capacitors $C_{o1}$ and $C_{o2}$ are connected in parallel to the both poles of the single-type converter, respectively, and receive the output voltages of the single-type converter, respectively.

Likewise, the first and second output capacitors $C_{o3}$ and $C_{o4}$ are arranged symmetrically with respect to the neutral point of the single-type converter, and one ends thereof are connected in series to each other. In addition, the other ends of the first and second output capacitors $C_{o3}$ and $C_{o4}$ are connected to the both poles of the single-type converter, respectively. That is, the first and second output capacitors $C_{o3}$ and $C_{o4}$ output the output voltages of the single-type converter, respectively.

The output voltage and current measurement unit 20 measures output voltages and output currents output to the both poles of the output terminals of the power input/output unit 10, respectively. That is, the output voltage and current measurement unit 20 respectively measures the output voltages $V_{o1}$ and $V_{o2}$ and the output currents $I_{o1}$ and $I_{o2}$ output from the both poles of the output terminals of the power input/output unit 10 and transfers the output voltages $V_{o1}$ and $V_{o2}$ and the output currents $I_{o1}$ and $I_{o2}$ to the controller 50.

The switching unit 30 is switched on the basis of the output voltage state applied to the both poles of the single-type converter. Here, the switching unit 30 includes first to fourth switching units $S_{13}$, $S_{14}$, $S_{15}$, and $S_{16}$.

The first and fourth switching units $S_{13}$ and $S_{16}$ each have one ends connected in parallel to the first and second input capacitors $C_{o1}$ and $C_{o2}$, respectively, and the other ends connected in series to the second and third switching units $S_{14}$ and $S_{15}$, respectively. In addition, the second and third switching units $S_{14}$ and $S_{15}$ are arranged symmetrically with respect to the neutral point of the single-type converter, and one ends thereof are connected in series to each other. That is, the second and third switching units $S_{14}$ and $S_{15}$ are connected in parallel to the first and second input capacitors $C_{o1}$ and $C_{o2}$, respectively.

That is, the first and fourth switching units $S_{13}$ and $S_{16}$ are connected in parallel to one ends of the first and second input capacitors $C_{o1}$ and $C_{o2}$, respectively, and the second and third switching units $S_{14}$ and $S_{15}$ are connected in series to one ends of the first and fourth switching units $S_{13}$ and $S_{16}$, respectively.

The power transfer unit 40 transfers the output voltages of the both poles of the single-type converter to the loads $R_1$ and $R_2$ according to the switching of the switching unit 30. Here, the power transfer unit 40 includes first to third inductors $L_4$, $L_5$ and $L_6$.

The first inductor $L_4$ is connected in parallel to the first and second input capacitors $C_{o1}$ and $C_{o2}$ and in series to the second and third switching units $S_{14}$ and $S_{15}$. That is, a connection point between the first and second input capacitors $C_{o1}$ and $C_{o2}$ and a connection point between the second and third switching units $S_{14}$ and $S_{15}$ are connected to each other by the first inductor $L_4$. The second inductor $L_5$ is connected in parallel to the second switching unit $S_{14}$ and in series to the first output capacitor $C_{o3}$. The third inductor $L_6$ is connected in parallel to the third switching unit $S_{15}$ and in series to the second output capacitor $C_{o4}$.

The controller 50 checks the output state of the both poles of the single-type converter using the output voltages $V_{o1}$ and $V_{o2}$ and the output currents $I_{o1}$ and $I_{o2}$ of the both poles of the output terminals measured by the output voltage and current measurement unit 20. Here, the output state of the both poles of the single-type converter might be an overcurrent state of the output currents and an unbalanced state of the output loads.

First, the controller 50 determines the overcurrent state of the output currents using the output currents $I_{o1}$ and $I_{o2}$. That is, the controller 50 compares the preset reference current with the output currents $I_{o1}$ and $I_{o2}$, and determines a state where an overcurrent occurs in the output side.

The controller 50 performs a current limiting function on the output side for limiting the currents of the output currents $I_{o1}$ and $I_{o2}$ through switching of the switching unit 30 according to the above-described comparison result. In this case, the controller 50 controls the switching of the first and fourth switching units $S_{13}$ and $S_{16}$.

Specifically, the controller 50 controls the switching of the first and fourth switching units 31 and 34 for the current limiting function on the output side in the case of a short circuit state of both poles or an overcurrent state when the loads $R_1$ and $R_2$ are under the same condition. In this case, through the switching of the first and fourth switches $S_{13}$ and $S_{16}$, the voltages of the output voltages $V_{o1}$ and $V_{o2}$ are reduced equally, whereby the output currents are limited.

In addition, in the case of a state that an overload or a short circuit occurs in either one of the both poles, the controller 50 controls the switching of the switching unit 30 to perform the current limiting function for the one corresponding pole, and, at the same time, controls the switching of the switching unit 30 to maintain the output voltage in a steady state for the one other pole.

Hereinafter, a description will be made of a process in which the controller 50 performs a current limiting function for the one pole where a situation of an overload or a short circuit occurs, while simultaneously performing voltage control on the one other pole.

When an overload or a short circuit occurs in either one of the both poles, and the current limiting function is performed for the one corresponding pole, the output voltage rises at the other pole. In this case, the rise of the output voltage at the one other pole may play a role as a stumbling block against securing the reliability of the stable low-voltage DC distribution line.

With reference to FIG. 2, the output voltages $V_{dc1}$ and $V_{dc2}$ of the single-type converter are controlled as follows. That is, the output voltages $V_{dc1}$ and $V_{dc2}$ of the single-type converter are represented by $V_{dc1}+V_{dc2}=V_{dc\_ref}$ (1500 V). In addition, the output voltages $V_{dc1}$ and $V_{dc2}$ are transferred to the loads $R_1$ and $R_2$ with $V_{dc1}=V_{o1}$ and $V_{dc2}=V_{o2}$ under normal load conditions. Since $V_{dc1}$ and $V_{dc2}$ are in an equilibrium state under normal load conditions, $V_{dc1}=V_{dc2}=750$ V. Therefore, under normal load conditions, the output voltages $V_{dc1}$ and $V_{dc2}$ of the final LVDC distribution are each 750V.

When an overload or a short circuit occurs in the output terminal of the output voltage $V_{o1}$, the controller 50 controls the switching of the first switching unit $S_{13}$ and reduces the output voltage $V_{o1}$, thereby performing the output current limiting function.

However, even in this case, the output voltage $V_{out}$ of the single-type converter is always controlled to be equal to the voltage $V_{dc\_ref}$. Accordingly, the load unbalance occurs because of the overload or the short circuit of the one pole, so that the output voltages $V_{dc1}$ and $V_{dc2}$ of the single-type converter become an unbalanced state (that is, $V_{dc1} \neq V_{dc2}$). That is, when the overload or the short circuit situation occurs in the one pole, the normal voltage may not be maintained in the other pole, and the protection device installed in the other pole also begins operation.

Here, the current limiting function and the voltage balancing function may not be performed at the same time. That is, when the output voltage balancing function is operated to compensate the load unbalance because of the current limiting operation, the output voltage may not be reduced because of the output voltage balancing operation. Consequentially, the current limiting function and the voltage balancing function may not be performed simultaneously. The voltage balancing function will be described later.

In the case where the controller 50 does not control the voltage of the other pole having a normal load condition (that is, the sound pole in which no condition of the overload or the short-circuit has occurred), the output voltage $V_{dc2}$ of the single-type converter is directly transferred to the output voltage $V_{o2}$ of the output terminal. In this case, the fourth switching unit $S_{16}$ is not controlled for switching thereof by the controller 50 and maintains a turned-on state. That is, as performing the current limiting function because of the overload or the short circuit of the output terminal of the output voltage $V_{o1}$, the controller 50 controls only the switching of the first switching unit $S_{13}$.

Then, because the load of the output terminal of the output voltage $V_{o2}$ is smaller than the load of the output terminal of the output voltage $V_{o1}$, the output voltage $V_{o2}$ becomes greater than the output voltage $V_{o1}$ (that is, $V_{o2}>V_{o1}$). In addition, as the output voltages $V_{dc1}$ and $V_{dc2}$ of the single-type converter satisfy '$V_{dc1}+V_{dc2}=1500$ V' and the $V_{o2}$ becomes as $V_{dc2}=V_{o2}$, the output voltage $V_{dc2}$ of the final LVDC distribution is not controlled to 750 V and begins increasing. That is, the output voltage $V_{o2}$ of the output terminal is also not controlled to 750 V and begins increasing.

As described above, when the controller 50 controls switching only for the first switching unit $S_{13}$, the output voltage $V_{o2}$ of the output terminal is not controlled and increases. Accordingly, the controller 50 performs the voltage control so that the output voltage $V_{o2}$ of the output terminal is controlled to a voltage of 750V in the normal state, by controlling also the switching of the fourth switching unit $S_{16}$.

In other words, when the overload or the short circuit occurs in the one pole, the controller 50 performs a current limiting function for the one pole in which the overload or the short circuit occurs. At the same time, through a voltage control to maintain the normal voltage state for the one other pole (that is, the sound pole), the controller 50 maintains the output voltage in a normal state.

Next, the controller 50 determines the unbalanced state of the output loads using the output voltages $V_{o1}$ and $V_{o2}$. That is, the controller 50 compares the preset reference voltage and the 'difference between the output voltages of the both poles' (that is, the difference between the output voltages $V_{o1}$ and $V_{o2}$) and determines the situation that the output loads are unbalanced.

The controller 50 performs a voltage balancing function for the output voltages $V_{o1}$ and $V_{o2}$ through the switching of the switching unit 30 according to the above-described comparison results. In this case, the controller 50 controls the switching of the second and third switching units $S_{14}$ and $S_{15}$.

Figure 3:
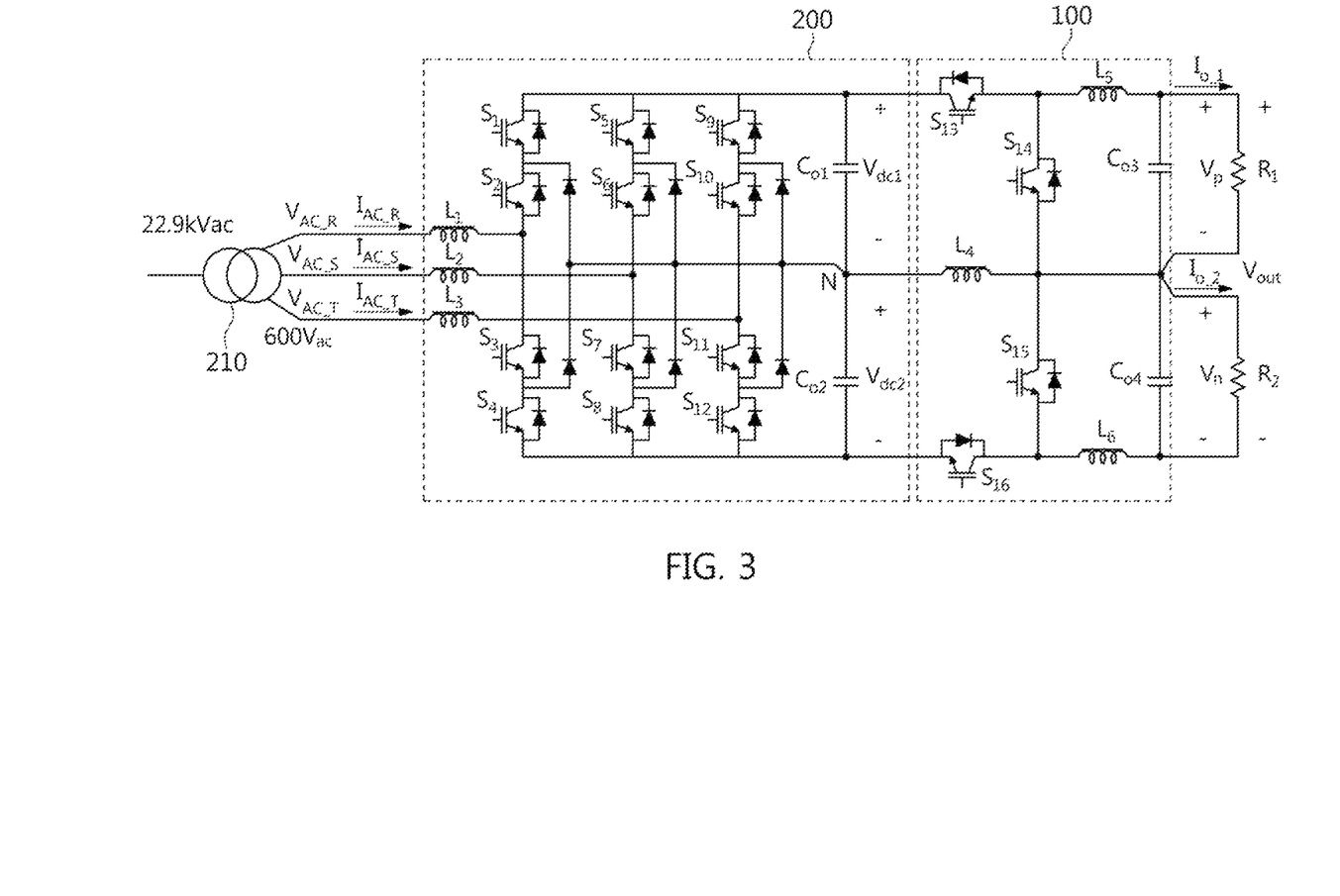
FIG. 3 is a detailed circuit diagram illustrating a configuration in which a single-type converter is coupled with an apparatus for controlling an output voltage of the present invention.

FIG. 3 is a detailed circuit diagram illustrating a configuration in which a single-type converter is coupled with an apparatus for controlling an output voltage of the present invention.

As described in FIG. 3, the single-type converter 200 is connected to an AC side through a transformer 210, converts the AC supplied from the transformer 210 to DC, and outputs the DC in the bipolar method to the apparatus for controlling the output voltage 100.

Because a technique of converting the AC of the transformer 210 into the DC through the single-type converter 200 and outputting the DC in the bipolar method is a well known technique, a description of more specific implementation process will be omitted. Meanwhile, a description on the single-type converter 200 implemented by various technologies that are either well known or not disclosed may be included.

The apparatus for controlling the output voltage 100 according to the present embodiment may detect the unbalance of the both poles on the basis of the output voltages of the single-type converter 200 input to the first input capacitor $C_{o1}$ and the second input capacitor $C_{o2}$, and eliminate the unbalance by switching the second or third switching unit $S_{14}$ or $S_{15}$ when the unbalance of the output voltages of the both poles is detected.

In addition, the apparatus for controlling the output voltage 100 according to the present embodiment may detect the overload occurring in the process of transferring the output voltage and eliminate the overload through limiting or cutting off the current by switching the first or fourth switching unit $S_{13}$ or $S_{16}$ when the overload is detected.

In addition, when the overload occurred during the transfer of the output voltage is detected only in the output current $I_{o1}$, the apparatus for controlling the output voltage 100 according to the present embodiment may control the current by switching the first switching unit $S_{13}$ and keep the output voltage $V_n$ of the lower pole to be constant by switching the fourth switching unit $S_{16}$.

Likewise, when the overload occurred during the transfer of the output voltage is detected only in the output current $I_{o1}$, the apparatus for controlling the output voltage 100 according to the present embodiment may control the current by switching the fourth switching unit $S_{16}$ and keep the output voltage $V_n$ of the upper pole to be constant by switching the first switching unit $S_{13}$.

Figure 4A:
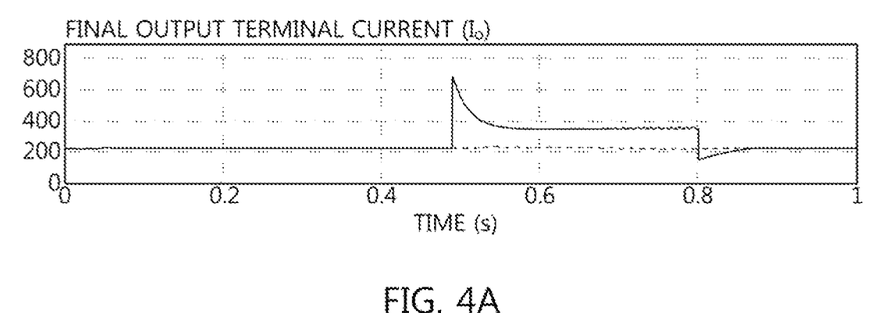
FIGS. 4A to 4C are graphs illustrating a case where only a current limiting function is performed.
Figure 4B:
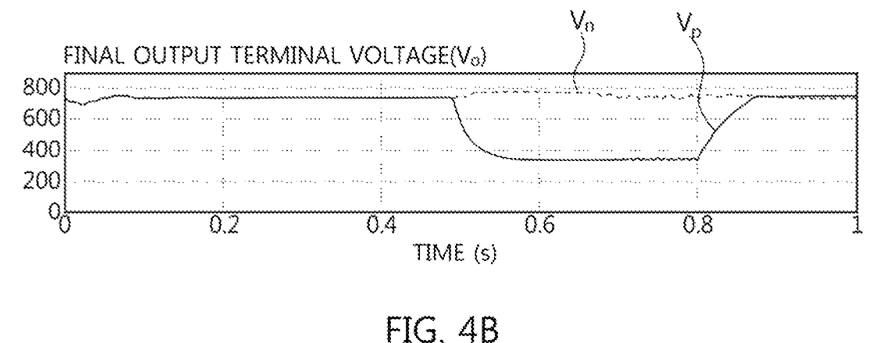
Figure 4C:
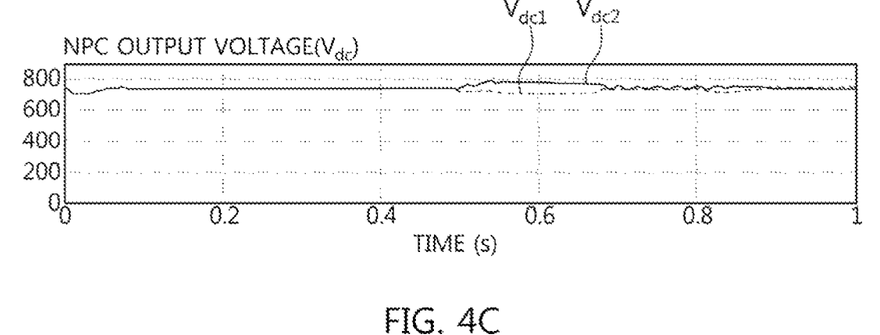
Figure 5A:
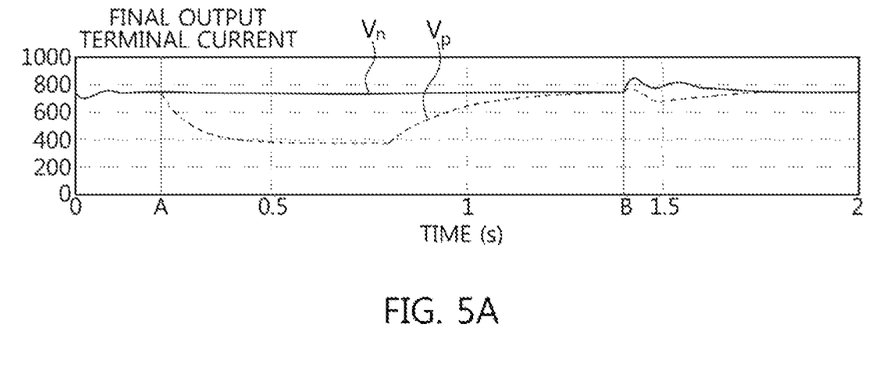
FIGS. 5A to 5C are graphs illustrating a case where a current limiting function and a voltage controlling function are performed at the same time.
Figure 5B:
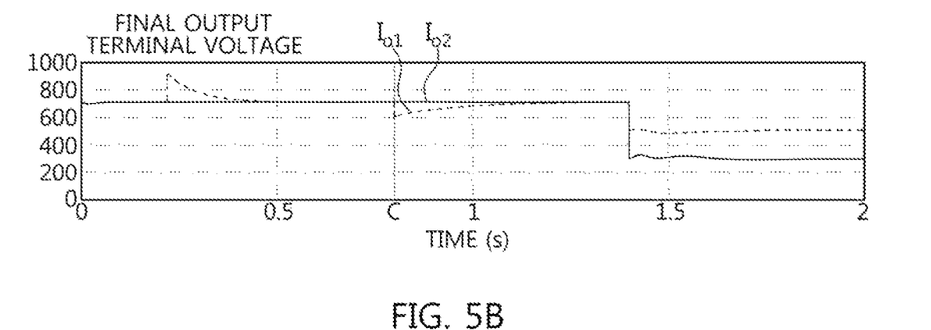
Figure 5C:
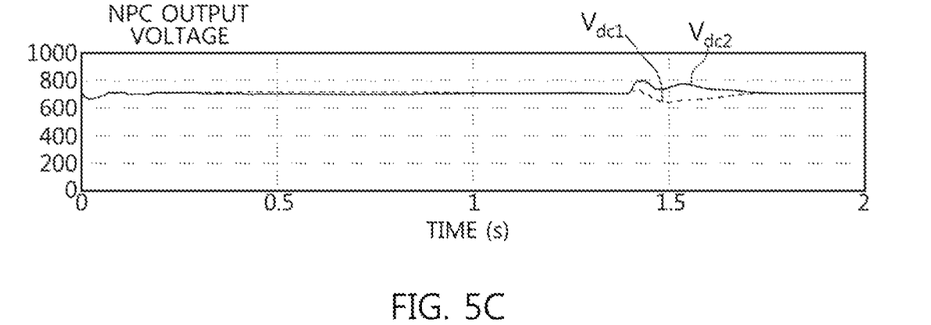

FIGS. 4A to 4C are graphs illustrating a case where only a current limiting function is performed, and FIGS. 5A to 5C are graphs illustrating a case where a current limiting function and a voltage controlling function are performed at the same time.

FIGS. 4A to 4C and FIGS. 5A to 5C illustrate a case where an overload or a short-circuit current occurs at a pole of one side. However, FIGS. 4A to 4C illustrate a case where the controller 50 performs only the current limiting function for the pole of the one side, and FIGS. 5A to 5C illustrate the case where the controller 50 performs the current limiting function for the pole of the one side and performs the voltage control function for the pole of the other side.

With reference to FIGS. 4A to 4C, it is confirmed that the output voltage of the NPC terminal and the output voltage of the final output terminal are both not maintained at 750 V and begin increasing for the other pole in which the overload or the short circuit condition has not occurred. With reference to FIGS. 5A to 5C, the output voltage of the NPC terminal and the output voltage of the final output terminal are maintained at 750 V for the other pole in which the overload or the short circuit condition has not occurred. That is, when the overload or the short circuit occurs in the pole of one side, it is confirmed that the final output voltage of the single-type converter of the pole of the other side is continuously maintained at 750 V even though the controller 50 operates the current limiting function for protection coordination.

As described above, even when the overload or the short circuit occurs in the DC distribution electric lines of the bipolar method, the apparatus for controlling the output voltage 100 may provide a function capable of stably maintaining the final output voltage of the single-type converter and of operating the protection coordination.

Figure 6:
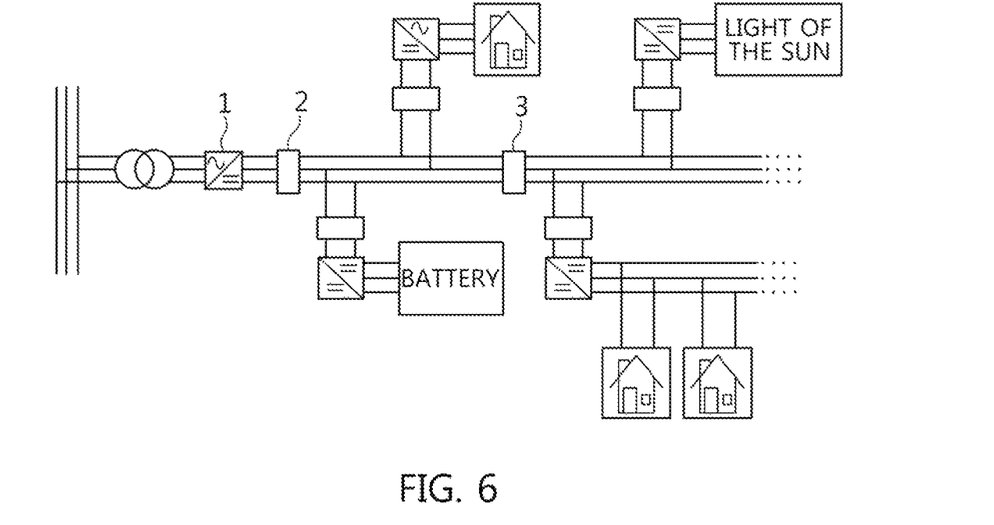
FIG. 6 is a view illustrating a case where an apparatus for controlling an output voltage is applied to a single-type converter for DC distribution of an actual system.

FIG. 6 is a view illustrating a case where an apparatus for controlling an output voltage is applied to a single-type converter for DC distribution of an actual system.

FIG. 6 illustrates a case where the single-type converter 1, a first protection device 2, and a second protection device 3 are installed in the actual system.

The actual system of FIG. 6 illustrates LVDC distribution electric lines. By constructing the LVDC distribution electric lines of the bipolar method, the power company may stably supply the DC power of the LVDC distribution system. The single-type converter 1 for providing DC power supply is supplied along with the DC distribution line, wherein the single-type converter is economical, compact, high in output quality, and capable of performing bidirectional power transmission through a connection of a new renewable source. The LVDC distribution electric lines may be applied to DC systems such as an internet data center (IDC) adopting a DC system of the bipolar structure, a factory, and so on within consumers and to DC micro-grids.

Meanwhile, when a short-circuit failure occurs in a positive (+) pole of the section after the second protection device 3, the single-type converter 1 should perform a function of maintaining a fault current equal to or greater than a rated current in order to block the section where the failure occurred and to perform protection coordination for the protection of the sound section through an operation of the first protection device 2 and the second protection device 3. In this case, when the single-type converter 1 as a single-type converter for DC distribution of DC power supply applies the current limiting function for the protection cooperation in case of the short circuit failure of the one pole necessary for actual use in DC distribution lines having the bipolar structure, the apparatus for controlling the output voltage 100 performs voltage control so that the other sound pole is not affected.

Figure 7:
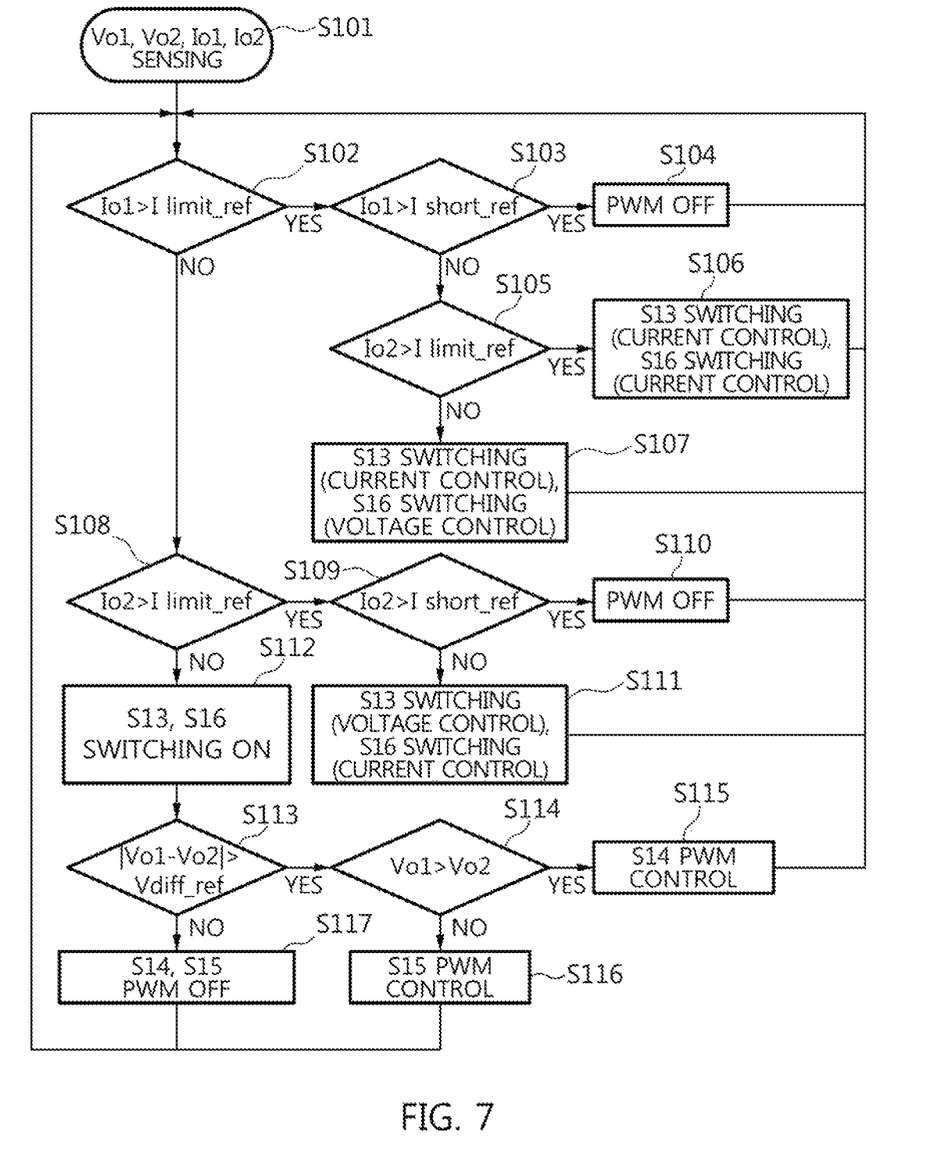
FIG. 7 is a view illustrating a method for controlling an output voltage for a single-type converter according to an embodiment of the present invention.

FIG. 7 is a view illustrating a method for controlling an output voltage for a single-type converter according to an embodiment of the present invention.

The controller 50 senses the output voltages $V_{o1}$ and $V_{o2}$ and the output currents $I_{o1}$ and $I_{o2}$ in S101.

Then, the controller 50 compares the output currents $I_{o1}$ and $I_{o2}$ with an $I_{limit\_ref}$ which is a preset current limit value, to determine the overcurrent state of the output currents $I_{o1}$ and $I_{o2}$ in S102 and S108.

First, the controller 50 compares the output current $I_{o1}$ with the current limit value $I_{limit\_ref}$ in S102. When the output current $I_{o1}$ is greater than the current limit value $I_{limit\_ref}$ in S102, the controller 50 compares the output current $I_{o1}$ with an $I_{short\_ref}$ which is the rectifier maximum allowable current, in S103. That is, when the output current $I_{o1}$ is greater than the maximum allowable current $I_{short\_ref}$ in S103, the controller 50 turns off the switches of the entire balancing circuits to protect the rectifier, thereby preventing the rectifier from being damaged in S104.

In addition, when the output current $I_{o1}$ is not greater than the rectifier maximum allowable current $I_{short\_ref}$ in S103, the controller 50 compares the output current $I_{o2}$ with the current limit value $I_{limit\_ref}$ in S105. A magnitude of the output current $I_{o2}$ is also compared with the current limit value $I_{limit\_ref}$ as above to determine whether there is an overcurrent condition for the entire poles.

At this time, when the output current $I_{o2}$ is greater than the current limit value $I_{limit\_ref}$ in S105, the controller 50 starts a current limit control by reducing the output voltages $V_{o1}$ and $V_{o2}$ of the both poles through switching on of the first switch $S_{13}$ and the fourth switch $S_{16}$ in S106. That is, when the output currents $I_{o1}$ and $I_{o2}$ are greater than the current limit value $I_{limit\_ref}$, the controller 50 performs the current limit control on the output currents $I_{o1}$ and $I_{o2}$ through the switching of the first and fourth switches $S_{13}$ and $S_{16}$.

On the other hand, when the output current $I_{o2}$ is not greater than the current limit value $I_{limit\_ref}$ in S105, the controller 50 determines that an overcurrent has occurred only at the output side of the output current $I_{o1}$ and starts the current limit control by decreasing the output voltage $V_{o1}$ using the first switch $S_{13}$ in S107. At this time, because the output voltage $V_{o2}$ rises through the switching on of the first switch $S_{13}$, the controller 50 starts the voltage control to 750 V for the output voltage $V_{o2}$ of the lower balancing circuit through the switching on, too, of the fourth switch $S_{16}$, in S107. That is, when the overcurrent is occurred only in the output current $I_{o1}$, the controller 50 performs the current limitation on the output current $I_{o1}$ through the switching of the first switch $S_{13}$ and, at the same time, performs the voltage control for the output voltage $V_{o2}$ through the switching of the fourth switch $S_{16}$.

Meanwhile, when the output current $I_{o1}$ is not greater than the current limit value $I_{limit\_ref}$ in S102, the controller 50 compares the output current $I_{o2}$ with the current limit value $I_{limit\_ref}$ in S108.

At this time, when the output current $I_{o2}$ is greater than the current limit value $I_{limit\_ref}$ in S108, the controller 50 compares the output current $I_{o2}$ with the rectifier maximum allowable current $I_{short\_ref}$ in S109.

When the output current $I_{o2}$ is greater than the maximum permissible current $I_{short\_ref}$ in S109, the controller 50 turns off the switches of the entire balancing circuits to protect the rectifier, thereby preventing the rectifier from being damaged in S110.

On the other hand, when the output current $I_{o2}$ is not greater than the rectifier maximum allowable current $I_{short\_ref}$ in S109, the controller 50 determines that an overcurrent has occurred only at the output side of the output current $I_{o2}$ and starts the current limit control by decreasing the output voltage $V_{o2}$ using the fourth switch $S_{16}$ in S111. At this time, because the voltage of the output voltage $V_{o1}$ rises through the switching-on of the fourth switch $S_{16}$, the controller 50 starts the voltage control to 750 V for the output voltage $V_{o1}$ of the upper balancing circuit through the switching on, too, of the first switch $S_{13}$, in S111. That is, when the overcurrent is occurred only in the output current $I_{o2}$, the controller 50 performs the current limitation on the output current $I_{o2}$ through the switching of the fourth switch $S_{16}$ and, at the same time, performs the voltage control for the output voltage $V_{o1}$ through the switching of the first switch $S_{13}$.

Then, when the output currents $I_{o1}$ and $I_{o2}$ are not greater than the current limit value $I_{limit\_ref}$ in S102 and S108, the controller 50 determines that the output currents are in a normal state and maintains the switching of the first switch $S_{13}$ and the fourth switch $S_{16}$ to an ON state in S112.

Meanwhile, the controller 50 compares 'the voltage difference between the output voltages $V_{o1}$ and $V_{o2}$' with a $V_{diff\_ref}$, which is a voltage difference reference value, to determine the output load unbalance state in S113.

At this time, when 'the voltage difference between the output voltages $V_{o1}$ and $V_{o2}$' is greater than the voltage difference reference value $V_{diff\_ref}$ in S113, the controller 50 compares the voltage magnitudes of the output voltages $V_{o1}$ and $V_{o2}$ with each other in S114. In this case, when the output voltage $V_{o1}$ is greater than the output voltage $V_{o2}$ in S114, the controller 50 performs the voltage control on the output voltage $V_{o1}$ of the upper balancing circuit through switching on of the second switch $S_{14}$ in S115. On the other hand, when the output voltage $V_{o1}$ is not greater than the output voltage $V_{o2}$ in S114, the controller 50 performs the voltage control on the output voltage $V_{o2}$ of the lower balancing circuit through the switching-on of the third switch 515 in S116.

In addition, when 'the voltage difference between the output voltages $V_{o1}$ and $V_{o2}$' is not greater than the voltage difference reference value $V_{diff\_ref}$ in S113, the controller 50 determines that unbalance does not occur at the output load sides of the output voltages $V_{o1}$ and $V_{o2}$, and switches off the second switch $S_{14}$ and the third switch $S_{15}$ in S117.

As described above, in the case of the occurrence of the overcurrent or the short circuit current when the overload or the short-circuit fault occurs in a pole of one side in S107 and S111, the controller 50 maintains the output voltage to be constant through the voltage control in order to maintain the normal voltage state for the sound pole of the opposite side too.

Consequently, the apparatus for controlling the output voltage 100 may solve the voltage unbalance problem when current is limited for protection coordination.

The above-described embodiments of the present invention are exemplary only and it will be apparent to those skilled in the art that various modifications and variations may be made in the present invention without departing from the spirit or scope of the invention. Accordingly, it is to be understood that the present invention is not limited to the above-described embodiments. Accordingly, the true scope of the present invention should be determined by the technical idea of the appended claims. It is also to be understood that the invention includes all modifications, equivalents, and alternatives falling within the spirit and scope of the invention as defined by the appended claims.

The invention claimed is:

1. An apparatus for controlling an output voltage for a single-type converter, the apparatus comprising:
   a power input/output unit connected in parallel to both poles of the single-type converter, respectively, thereby receiving and outputting output voltages, respectively;
   an output voltage and current measurement unit measuring output currents and the output voltages output from the power input/output unit;
   a controller performing a current limit control for a protection coordination for a first pole in the case of a state that an overload or a short circuit occurs in the first pole, and performing simultaneously a voltage control through a current control for a second pole following a checking of a state of the first pole of the both poles of the single-type converter using the measured output currents;
   a switching unit being switched according to a control performed on the both poles; and
   a power transfer unit transferring the output voltages of the single-type converter according to switching of the switching unit,
   wherein the controller performing a voltage valancing according to determining an unbalanced state the output voltage as to the first pole and the second pole, when the output voltage state of the first pole and the second pole is determined as the normal state after performing the current limiting control for the first pole and the voltage control for the second pole.

2. The apparatus of claim 1, wherein the power input/output unit includes first and second input capacitors connected in parallel to the both poles of the single-type converter, respectively, thereby receiving the output voltages, respectively; and first and second output capacitors outputting the output voltages of the single-type converter, respectively.

3. The apparatus of claim 2, wherein the switching unit includes first and fourth switching units connected in parallel to one ends of the first and second input capacitors, respectively; and second and third switching units connected in series to one ends of the first and fourth switching units, respectively and connected in parallel with respect to the first and second input capacitors, respectively.

4. The apparatus of claim 3, wherein, when performing a current limit control on the first pole and performing a voltage control on the second pole, the controller controls switching of the first and fourth switching units.

5. The apparatus of claim 3, wherein the controller performs the current limit control for the first and second poles following the checking of the state of the both poles of the single-type converter using the measured output currents.

6. The apparatus of claim 5, wherein the controller controls switching of the first and fourth switching units.

7. The apparatus of claim 3, wherein the controller performs the voltage control for the first and second poles following the checking of the state of the both poles of the single-type converter using the measured output voltages.

8. The apparatus of claim 7, wherein the controller controls switching of the second and third switching units.

9. A method for controlling an output voltage for a single-type converter, the method comprising:
   measuring output voltages and currents output from both poles of the single-type converter, respectively;

performing a current limit control for a first pole for protection coordination in the case of a state that an overload or a short circuit occurs in the first pole, following checking a state of output currents output from the first pole of the both poles of the single-type converter;

performing simultaneously a voltage control through a current control for a second pole of the both poles of the single-type converter; and performing a voltage valancing according to determining an unbalanced state the output voltage as to the first pole and the second pole, when the output voltage state of the first pole and the second pole is determined as the normal state after performing the current limiting control for the first pole and the voltage control for the second pole.

10. The method of claim 9, further comprising:
after the measuring, performing the current limit control for the first and second poles following checking a state of the output currents output from the both poles of the single-type converter.

11. The method of claim 9, further comprising:
after the measuring, performing the voltage control for the first and second poles following checking a state of the output voltages output from the both poles of the single-type converter.

* * * * *